US012437954B2

(12) United States Patent
Pantha et al.

(10) Patent No.: US 12,437,954 B2
(45) Date of Patent: Oct. 7, 2025

(54) SUBSTRATE STACK EPITAXIES FOR PHOTOCATHODES FOR EXTENDED WAVELENGTHS

(71) Applicant: L3Harris Technologies, Inc., Melbourne, FL (US)

(72) Inventors: Bed Pantha, Chandler, AZ (US); Jacob J. Becker, Gilbert, AZ (US); Jon D. Burnsed, Tempe, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 471 days.

(21) Appl. No.: 17/979,639

(22) Filed: Nov. 2, 2022

(65) Prior Publication Data
US 2024/0145202 A1    May 2, 2024

(51) Int. Cl.
*H01J 1/34*       (2006.01)
*H01J 9/12*       (2006.01)

(52) U.S. Cl.
CPC ................... *H01J 1/34* (2013.01); *H01J 9/12* (2013.01); *H01J 2201/3423* (2013.01)

(58) Field of Classification Search
CPC .................... H01J 9/12; H01J 1/34
USPC ......................................................... 257/11
See application file for complete search history.

(56) References Cited

U.S. PATENT DOCUMENTS

| | | | |
|---|---|---|---|
| 3,958,143 A | 5/1976 | Bell | |
| 5,268,570 A | 12/1993 | Kim | |
| 5,610,078 A | 3/1997 | Estrera et al. | |
| 5,795,325 A | 8/1998 | Valley et al. | |
| 5,912,500 A | 6/1999 | Costello et al. | |
| 6,110,758 A | 8/2000 | Estrera et al. | |
| 6,558,973 B2 | 5/2003 | Johnson et al. | |
| 7,457,338 B2 | 11/2008 | Mawst et al. | |
| 7,915,640 B2 * | 3/2011 | Uemura | H10D 10/021 257/190 |
| 9,768,339 B2 | 9/2017 | Yanka et al. | |
| 10,355,159 B2 | 7/2019 | Misra et al. | |

(Continued)

FOREIGN PATENT DOCUMENTS

CN     113690119 A    11/2021

OTHER PUBLICATIONS

"Metamaterial photocathode for infrared image intensifier", Retrieved from https://techlinkcenter.org/technologies/metamaterial-photocathode-for-infrared-image-intensifier/7927eb70-db47-496a-92ed-7428b1f41a98, Retrieved on Sep. 30, 2022, 4 pages.

(Continued)

*Primary Examiner* — Christopher M Raabe
(74) *Attorney, Agent, or Firm* — NIXON & VANDERHYE P.C.

(57) ABSTRACT

A photocathode epitaxial structure. The photocathode epitaxial structure includes an improved substrate stack. The improved substrate stack includes a GaAs substrate and one or more additional layers formed on the GaAs substrate. The one or more additional layers are configured to provide an improved substrate stack surface with predetermined characteristics for forming a semiconductor device on the improved substrate stack surface. The photocathode epitaxial structure further includes an InGaAs p-type photocathode formed on the improved substrate stack surface. The InGaAs p-type photocathode has a predetermined percentage of In.

18 Claims, 5 Drawing Sheets

(56) References Cited

U.S. PATENT DOCUMENTS

| | | |
|---|---|---|
| 2011/0092955 A1 | 4/2011 | Purdy et al. |
| 2014/0276143 A1 | 9/2014 | Corl |
| 2017/0049359 A1 | 2/2017 | Arevalos et al. |
| 2017/0181760 A1 | 6/2017 | Look et al. |
| 2018/0207396 A1 | 7/2018 | Franklin |
| 2021/0290100 A1 | 9/2021 | Linder et al. |
| 2022/0042672 A1* | 2/2022 | Raring ................ H01S 5/4087 |
| 2023/0140407 A1 | 5/2023 | Samawi et al. |

OTHER PUBLICATIONS

Escher et al., "Photoelectric imaging in the 0.9-1.6 micron range", IEEE Electron Device Letters, vol. 2, Issue 5, May 1981, 123-125.

Estrera et al., "Development of extended red (1.0- to 1.3-μm) image intensifiers", SPIE's 1995 International Symposium on Optical Science, Engineering, and Instrumentation, 1995, vol. 2551.

Guo et al., "Near-infrared photocathode In0.53Ga0.47As doped with zinc: A first principle study", Optik, vol. 127, Issue 3, Feb. 2016, pp. 1268-1271.

Guo et al., "Theoretical study on electronic and optical properties of In0.53Ga0.47As (1 0 0) ß2 (2 × 4) surface", Applied Surface Science, vol. 288, Jan. 1, 2014, pp. 238-243.

Miller et al., "EMCORE four-junction inverted metamorphic solar cell development", AIP Conference Proceedings, vol. 1616, 2014, 5 Pages.

Muchun et al., "Photoemission behaviors of transmission-mode InGaAs photocathode", Proceedings of the SPIE, vol. 9270, 2014, 6 Pages.

Sachno et al., "Image intensifier tube (12) with 1.06-μm InGaAs-photocathode", 18th International Conference on Photoelectronics and Night Vision Devices and Quantum Informatics, 2004, vol. 5834, 7 Pages.

Xu et al., "Numerical simulation study on quantum efficiency characteristics of InP/InGaAs/InP infrared photocathode", International Symposium on Optoelectronic Technology and Application, 2016, vol. 10157, 8 Pages.

Yang et al., "Spectral response of InGaAs photocathodes with different emission layers", Applied Optics vol. 55, Issue 31, pp. 8732-8737, 2016.

Zhenhui et al., "Simulation of InP/In0.53Ga0.47As/InP infrared photocathode with high quantum yield", Infrared and Laser Engineering, 2019, 7 Pages.

European Search Report received for EP Patent Application No. 23206760.3, mailed on Mar. 5, 2024, 13 pages.

International Search Report and Written Opinion received for PCT Patent Application No. PCT/US2022/048866, mailed on Mar. 6, 2023, 11 pages.

* cited by examiner

SUBSTRATE STACK EPITAXIES FOR PHOTOCATHODES FOR EXTENDED WAVELENGTHS

BACKGROUND

Background and Relevant Art

Nightvision systems allow a user to see in low-light environments without external human visible illumination. This allows for covert vision in a low-light environment to prevent flooding the environment with human visible light.

Some nightvision systems function by receiving low levels of light reflected off of, or emitted from objects and providing that light to an image intensifier (sometimes referred to as $I^2$). The image intensifier has a photocathode. When photons strike the photocathode, electrons are emitted into a vacuum tube, and directed towards a microchannel plate to amplify the electrons. The amplified electrons strike a phosphor screen. The phosphor screen is typically chosen such that it emits human visible light when the amplified electrons strike the phosphor screen. The phosphor screen light emission is coupled, typically through an inverting fiber-optic, to an eyepiece where the user can directly view the illuminated phosphor screen, thus allowing the user to see the objects.

Spectral response from the state-of-the-art Gen III (GaAs) photocathodes cuts-off at around 900 nm. This may be satisfactory for implementing devices configured to observe objects that would normally be visible to humans in lighted conditions. However, this spectrum cut-off may be unsuitable for other uses. For example, it may be useful to have a device that functions with wavelengths up to a 1550 nm. This wavelength is particularly useful as it represents a maximum wavelength suitable for eye-safe lasers for manufacturing long-range rangefinders and/or laser guidance and laser painting systems. Thus, if a user desires to have a traditional nightvision system that also allows for viewing certain laser-based systems, this may not be possible with current technology. To the extent that current systems are able to function up to 1550 nm, those systems are generally manufactured using inferior manufacturing techniques which may reduce sensitivity overall, or at least portions of, the usable spectrum.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a photocathode epitaxial structure. The photocathode epitaxial structure includes an improved substrate stack. The improved substrate stack includes a GaAs substrate and one or more additional layers formed on the GaAs substrate. The one or more additional layers are configured to provide an improved substrate stack surface with predetermined characteristics for forming a semiconductor device on the improved substrate stack surface. The photocathode epitaxial structure further includes an InGaAs p-type photocathode formed on the improved substrate stack surface. The InGaAs p-type photocathode has a predetermined percentage of In.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

One embodiment illustrated herein includes a manufacturing process which, instead of GaAs structures used in photocathodes, uses high quality metamorphic InGaAs structures. Using these materials, embodiments can vary a band gap of the material from about 1.4 to 0.7 eV (i.e., 1.1 eV±30% at 300 Kelvin), allowing for extended spectrum as compared to previous GaAs photocathodes. Note that high quality metamorphic materials are created by a careful engineering and/or management of strain arising due to the difference in size of atoms in subsequent layers during epitaxial processes.

To create such a photocathode, proper design and implementation of substrate epitaxial layers, on which to form the photocathode is performed. For example, substrate epitaxial layers having step grades (i.e., stepped concentrations of Indium) with an overshoot buffer (i.e., having an Indium content percentage that exceeds the Indium content percentage of the InGaAs photocathode formed thereon) are formed. This facilitates forming a low defect density InGaAs photocathode on the substrate. Such processing is advantageous in that it reduces Equivalent Background Illumination (EBI) and increases Quantum Efficiency (QE). In some embodiments, this is used to tailor band gap and photocathode composition to meet particular specifications. For example, some embodiments are implemented having spectrum sensitivity between 1064 nm to 1200 nm. Other embodiments have even longer wavelength sensitivity.

Figure 1:
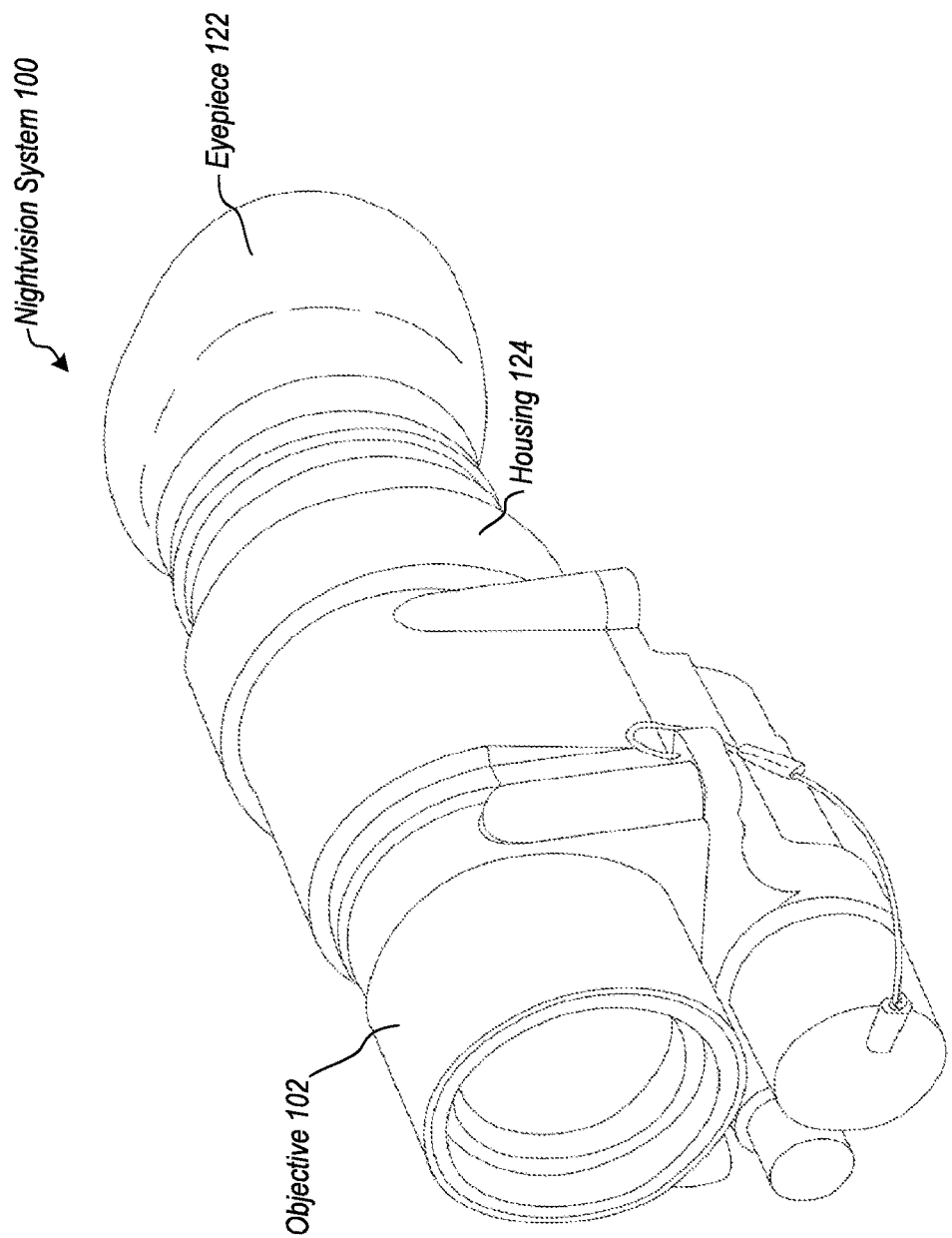
FIG. 1 illustrates an example nightvision system.

Additional details are illustrated. Attention is now directed to FIG. 1, where a specific example of a nightvision system is illustrated. In particular, FIG. 1 illustrates the PVS-14 nightvision system 100. In the example illustrated, the nightvision system 100 includes a housing 124. As will be illustrated in more detail below in other figures, the housing 124 houses an image intensifier and various other components. The nightvision system 100 further includes an objective 102 which receives weak light reflected and/or generated in an environment. The objective 102 includes optics such as lenses, waveguides, and/or other optical components for receiving and transmitting light to an image intensifier, discussed in more detail below. The nightvision system 100 further includes an eyepiece 122. The eyepiece 122 includes optics for directing images created by the nightvision system 100, including images created by an image intensifier and images created by a transparent optical device, into the eye of the user.

Figure 2:
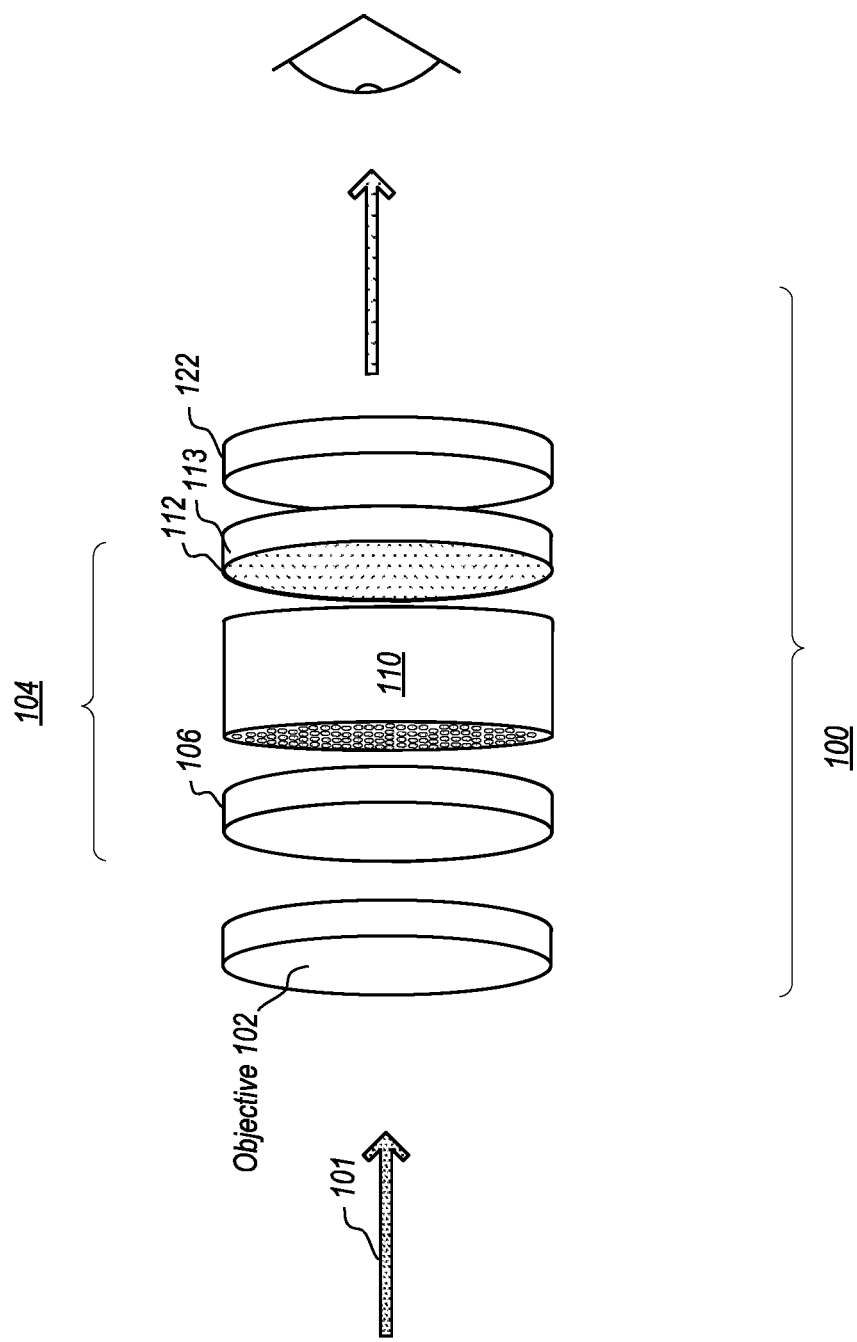
FIG. 2 illustrates a block diagram of portions of a nightvision system.

Attention is now directed to FIG. 2. FIG. 2 illustrates a block diagram of one embodiment of the invention. A nightvision system typically includes an objective 102 to focus input light 101 into an image intensifier 104. Input light 101 may be, for example, from ambient sources, such as light from heavenly bodies such as stars, the moon, or even faint light from the setting sun. Additionally, or alternatively, ambient sources could include light from buildings, automobiles, or other faint sources of light that cause reflection of light from an object being viewed in a nightvision environment into the objective. A second source of light may be light being emitted from an external source towards an object, reflected off the object, and into the objective. For example, the source may be an infrared source that is not viewable in the viewable spectrum for human observers. A third source of light may be light emitted by an object itself. For example, this may be related to visible light, infrared heat energy emitted by the object and directed into the objective, etc. Nonetheless, the nightvision system is able to convert the light emitted from the source into a viewable image for the user.

The objective directs input light 101 into the image intensifier 104. Note that the image intensifier 104 may include functionality for amplifying light received from the objective to create a sufficiently strong image that can be viewed by the user. This may be accomplished using various technologies. In the example of FIG. 2, a photocathode 106, a microchannel plate 110, and a phosphor screen 112 are used. The photocathode 106 generates photo electrons in response to incoming photons. Electrons from the photocathode 106 are emitted into the microchannel plate 110. Electrons are multiplied in the microchannel plate 110.

Electrons are emitted from the microchannel plate 110 to a phosphor screen 112 which glows as a result of electrons striking the phosphor screen 112. This creates a monochrome image from the input light 101.

A fiber-optic 113 carries this image as intensified light to the eyepiece (such as eyepiece 122 illustrated in FIG. 1 of a nightvision system where it can be output to the user. This fiber-optic 113 can be twisted 180 degrees to undo the inversion caused by the system objective to allow for convenient direct viewing of the phosphor screen 112.

Figure 3:
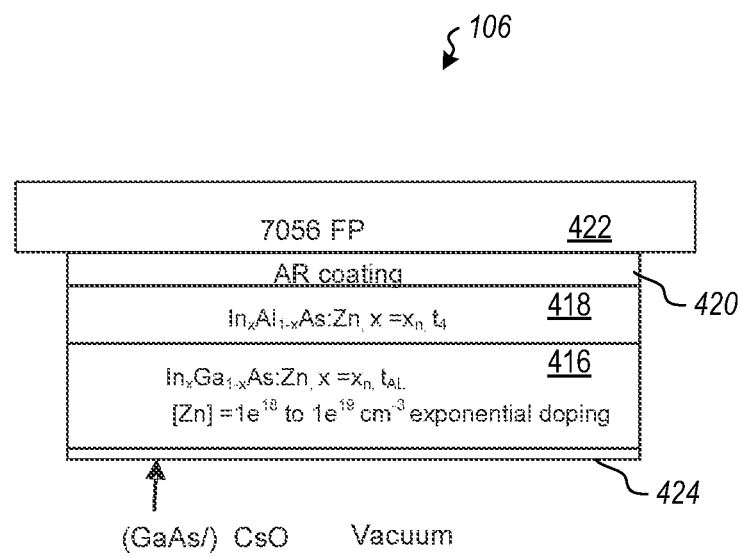
FIG. 3 illustrates an improved photocathode.

Embodiments may be implemented with an improved InGaAs photocathode 106, as illustrated in FIG. 3, that is sensitive to a broader spectrum of light as compared to previous GaAs designs. Note that the photocathode 106 illustrated in FIG. 3 is a p-type semiconductor device and is designed not to be a p-n junction type device. In particular, in some embodiments, the photocathode 106 includes intentionally formed p-type materials in bulk layers while excluding intentionally formed n-type material bulk layers. Thus, as used herein, a p-type device does not have intentionally formed n-type material bulk layers, nor does it include an intentionally formed p-n junction.

Figure 4:
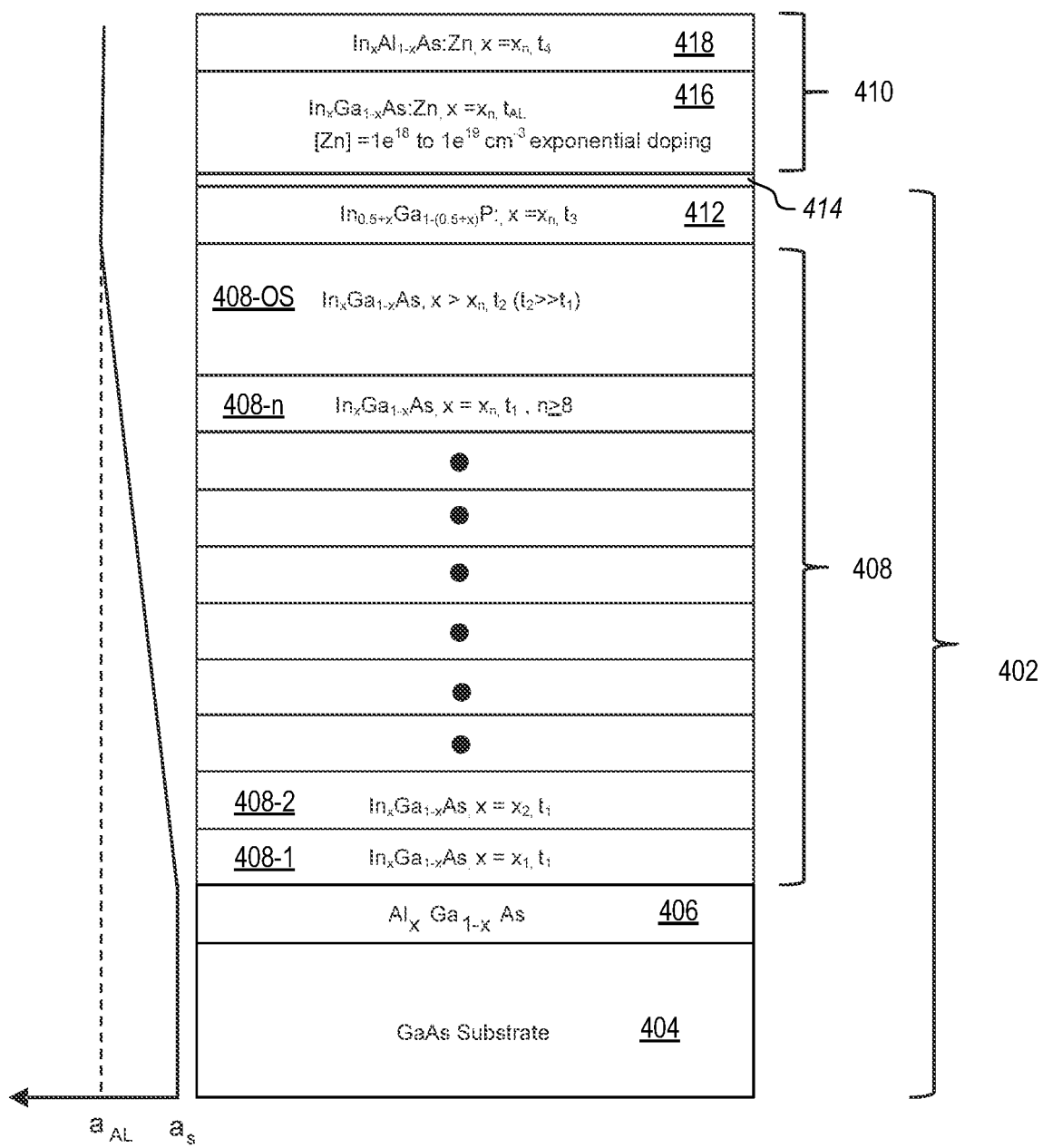
FIG. 4 illustrates an improved epitaxial structure for forming an improved photocathode.

To form the extended InGaAs photocathode 106, an improved substrate stack is implemented. Referring now to FIG. 4, a process for implementing the improved substrate stack 402 is illustrated. FIG. 4 illustrates a GaAs substrate 404. The GaAs substrate may be, for example, a commercially available GaAs wafer. An AlGaAs etch stop layer 406 is formed on the GaAs substrate. The aluminum percentage in the etch stop layer 406 is typically in the range of 60 to 80%. The AlGaAs etch stop layer 406 may be formed on the GaAs substrate 404 via any practicable growth, deposition, or/or other process. The AlGaAs etch stop layer 406 can be used as a barrier while etching GaAs substrates by using a specific mixture of chemicals which is a process step of fabrication of a transmission mode photocathode.

The step graded portion 408 of the improved substrate stack 402 includes various step graded epitaxial layers 408-1-408-$n$ and an overshoot layer 408-OS. These layers are formed on the etch stop layer 406 using various growth, deposition, and/or other processes.

The grading of the layers refers to the amount of Indium composition included in the layers. In particular, it is desirable to gradually increase the amount of Indium doping from layer to layer. This is done to limit atom spacing differences layer to layer to reduce strain and potential damage to the improved substrate stack 402. More particularly, the photocathode 106 has a particular amount of Indium composition in certain layers. If one or more of the photocathode layers 410 of photocathode 106 were simply formed on the GaAs substrate 404, the inclusion of significant amounts of Indium (e.g., 20% Indium) in the photocathode layers 410 would cause significant stress in the photocathode layers 410, thereby producing defects in the crystal structure of the photocathode layers 410, which is deleterious to optical, electronic, and/or mechanical properties.

Therefore, embodiments form step graded epitaxial layers 408-1-408-$n$ and overshoot layer 408-OS, which have gradually increasing amounts of Indium from step graded epitaxial layer 408-1 to overshoot layer 408-OS. This is done to have acceptably small differences in atom spacing between the various layers to target a predetermined, acceptably low strain in the crystalline structure of the epitaxial layers. For example, assume that the photocathode layers 410 are designed to have an Indium percentage of 20%. This percentage is selected to instill certain properties, such as optical properties allowing for detection of certain optical wavelengths. That is, a target band gap is selected and an appropriate amount of Indium is included in the photocathode to achieve the target band gap. Assume further that there are 11 step graded epitaxial layers in the step graded portion 408, including the overshoot layer 408-OS. The remain 10 layers may be designed to increase Indium doping by 2% per layer. Thus, step graded epitaxial layer 408-1 is formed with an Indium percentage of 2%. Step graded epitaxial layer 408-2 is formed with an Indium percentage of 4%. And, step graded epitaxial layer 408-$n$ is formed with an Indium percentage of 20%. Thus, the Indium percentage is gradually increased from zero in the GaAs substrate 404 and etch stop layer 406 to 20% in the step graded epitaxial layer 408-$n$ to approach or match the Indium percentage in layers of the photocathode layers 410.

Note that overshoot layer 408-OS overshoots the target Indium percentage. For example, assume again that the photocathode layers 410 are designed to have an Indium percentage of 20%. In this case, the overshoot layer 408-OS may have a target Indium doping percentage of 22% while the step graded epitaxial layer 408-n has a target Indium doping percentage of 20%.

Alternatively or additionally, in some embodiments, the overshoot layer 408-OS is thick as compared to the other step graded epitaxial layers 408-1-408-n. That is, the overshoot layer 408-OS is thick as compared to other layers between the overshoot layer 408-OS and the GaAs substrate 404. In this context, 'thick' means that the overshoot layer 408-OS is at least 150% as thick as the step graded epitaxial layer 408-n. In some embodiments, the overshoot layer 408-OS may be in a range of 150% to 1000%. In some embodiments, the overshoot layer 408-OS may be in a range of 200% to 300%.

In typical embodiments, the width of the overshoot layer will be determined by the final Indium composition and process conditions. It is desirable that the net strain in this layer is close to zero before growing the active device on it. As the thickness of this layer is increased, any residual strain will gradually relax until it becomes strain free, within some predetermined threshold. To accomplish a strain free condition, this layer is significantly thicker than other graded layers. This way, subsequent layers of the device (in this case the second etch stop 412, active layer 416, and window layer 418) can be strain free. Strain free means defect free, within a predetermined threshold. Note that having the overshoot layer be thicker than necessary to achieve a strain free layer is not deleterious to fabrication of the active device, nor does it generally create a geometry problem. Thus, having the thickness ($t_2$) of the overshoot layer be 2 to 5× of the thickness ($t_1$) of the other graded layers is an expected range. Below 150%, the overshoot layer 408-OS will not be sufficiently strain free. This would result in the active layer 416 growing with strain to begin with which will later relax as the thickness of the active layer increases. This would generate misfit defects in the active layer 416.

Note that overshooting the Indium percentage in the photocathode layers and/or implementing a thick, as used herein, overshoot step graded epitaxial layer has been shown to further manage strain, thus resulting in fewer defects in the crystal structure of the photocathode layers than without an overshoot and/or a thick step graded epitaxial layer.

Note that the various layers of the step graded portion 408 of the improved substrate stack may be formed by any appropriate process such as an appropriate growth, deposition, implantation and/or other appropriate process.

FIG. 3 further illustrates a second etch stop layer 412, which in this example is a phosphide etch stop layer as part of the improved substrate stack 402. Note that the etch stop layer 412 is not required to be a phosphide etch stop layer, rather, any suitable etch stop material can be used. For example, in some embodiments, the etch stop layer may be $In_xAl_{1-x}As$. The arsenide layers of the substrate stack 402 will be selectively removed by predetermined wet chemistries followed by this second etch stop layer 412 with different wet chemistries. Unlike in Al(In)GaAs etch stop, chemistries used in phosphide etch stop will not leave etch residues on the surface. Further, such chemistries will not partially etch the active layer. Having phosphide etch layers allows for exceptionally selective chemistries between the two different types of materials (Arsenide and Phosphide). Therefore, the atomic layers at the surface of photocathode (410) will retain their epitaxial quality. High surface quality includes characteristics such as being free of etch residues and having no added surface roughness due to an etch stop removal process. Therefore, the etch stop layer 412 is used to create a damage free or pristine surface of the active layer 416 or the layer on which CsO monolayers are deposited (also known as an activation process) in ultra-high vacuum conditions. Activation in a pristine surface will minimize the losses of photogenerated electrons arriving at the surface by interface trap states and hence will reduce Equivalent Background Illumination (EBI). The second etch stop layer may have, for example, a nominal thickness of about 2000 A. FIG. 4 further illustrates a fully strained p-type GaAs layer 414. In some embodiments, the fully strained layer 414 serves as a substrate for forming the photocathode layers 410. The thickness of this layer is determined by the indium percentage in the active layer 416 or is a predetermined thickness which is typically in the range of ~5 nm. Being a higher bandgap of GaAs (with respect to the band gap of the active layer 416), this layer 414 acts as a barrier for thermally generated electrons but freely passes energetic photogenerated electrons (in the active layer 416) through a quantum tunneling process on their way to the vacuum. Thus, this is another approach to minimize the EBI. In such case, CsO is deposited on this GaAs fully strained layer 414. Since this layer is too thin (typically ~5 nm), the etch stop layer (412) is selected in such a way that etch chemistries should be highly selective. The phosphide etch stop layer (412) can be selected so that process control can be realistically achieved. FIG. 4 illustrates that the photocathode layers 410 include an active layer 416 and a window layer 418. The active layer 416 of the photocathode is a p-type bulk layer having been fabricated to instill certain properties in the active layer 416 of the photocathode layers 410. Such properties may be, for example, optical properties allowing for detection of certain optical wavelengths. That is, a target band gap is selected, and an appropriate amount of Indium is included in the photocathode layers 410 to achieve the target band gap. In some embodiments, P-type doping is achieved by incorporating Zinc (Zn) atoms or beryllium (Be) during epitaxial forming processes via chemical vapor deposition process using a Zn precursor. The doping in the active layer is designed in such a way that it creates a linear internal electric field across the active layer thickness. Zn doping is exponentially increased as the thickness of active layer increases, such that highest doping occurs at an interface to the window layer 418 with doping increasing away from an interface between the active layer 416 and the substrate stack 402. A typical doping range is $1e^{18}$ to $1e^{19}$ atoms per cubic centimeter. In some embodiment, the doping range can be designed from $1e^{17}$ to $5e^{19}$ atoms per cubic centimeter range. The internal electric filed will accelerate the photogenerated electrons toward the vacuum thereby increasing the quantum efficiency of the photocathode.

For example, in some embodiments, an amount of Indium may be included to create a photocathode that is sensitive to light which includes 1064 nm wavelengths. This may be useful in 1064 nm laser applications. These lasers can be used for medical purposes to remove lesions and tumors. Alternatively, these lasers can be used for cutting and/or etching. These lasers can be used for flow visualizations. These lasers can be used for laser rangefinders and/or laser guidance and laser painting systems.

Alternatively or additionally, embodiments may implement the photocathode layers 410 having a near infrared spectrum of 900-1700 nm. This spectrum can be useful for laser range finders and designators as well as observation and detection of celestial bodies.

Alternatively or additionally, embodiments may implement the photocathode layers 410 having a spectrum of 1.7 to 3 um. This is one spectrum that has been referred to as short wave infrared. Note that this is a useful spectrum and represents the limit of systems that can use glass optics as glass optics become non-functional above 3 um.

Alternatively or additionally, embodiments may implement the photocathode layers 410 having a spectrum of 3 to 5 um, which is considered medium wavelength infrared. These devices are useful for seeing in occluded environments, such as environments having significant dust, cloud cover, or other occlusions. Additionally, this is a range that certain objects emit heat, such that heat of objects can be detected.

Alternatively or additionally, embodiments may implement the photocathode layers 410 having a long wave infrared spectrum of 8-12 um. This is typically where organic infrared emissions occur. Thus, detectors of this spectrum can be used to detect humans, animals, and the like.

Unlike photodiodes (which are PN junction devices), T-mode photocathodes, such as the photocathode layers 410 include only p-type bulk layers.

The active layer 416 may be formed via any practicable growth, deposition, or/or other process.

FIG. 4 further illustrates the window layer 418. A window layer 418 is a doped protective layer that protects the active layer 416. In particular, the window layer 418 provides passivation to prevent corrosion of the active layer 416. Note that while the window layer 418 is shown as an Arsenide type window layer, in some embodiments, a Phosphide window layer may be used to provide for better passivation than an Arsenide type window layer. The window layer 418 is doped such that it has a large band gap so as to not absorb light that is intended to reach the active layer 416. In some embodiments, the window layer 418 may be designed so as to reduce reflectivity of the photocathode layers 410 to allow for more light to be absorbed by the active layer 416 than if a more reflective surface were present on the photocathode layers 410.

Returning once again to FIG. 3, various finishing elements are illustrated. In particular, FIG. 3 illustrates that that an antireflective coating 420 is added over the window layer 418. A faceplate 422 is bonded to the photocathode. The faceplate 422, in this example is Corning 7056 glass. FIG. 3 further illustrates complete removal of GaAs substrate. This may be performed by etching, grinding, and/or other processes.

FIG. 3 illustrates that a CsO layer 424 may be added to create a negative electron affinity (NEA) surface. In an alternative embodiment, $Cs_2Te$ or CsF ($CsNF_3$ instead of $CsO_2$) may be used in place of CsO.

In some embodiments, an optional GaAs layer may also be added for better CsO activation and for electrons to tunnel though. In some embodiments, the optional GaAs layer is thinner than 5 nm. This thin GaAs layer acts as 1) a barrier for thermally generated electrons but passes energetic photogenerated electrons toward the vacuum via a quantum tunneling process; and 2) leverage to use known surface cleaning and activation processes to make a negative electron affinity (NEA) cathode. This layer is completely strained and sufficiently thin. Sufficiently thin means that photogenerated electrons can tunnel through this layer. The thickness of this layer can range from 20 A to 100 A The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 5:
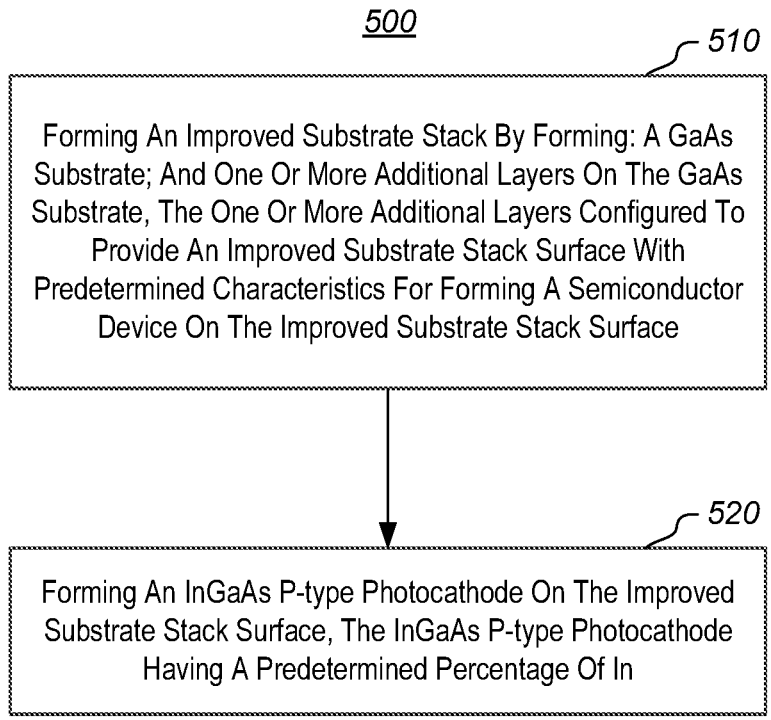
FIG. 5 illustrates a method of forming an improved photocathode.

Referring now to FIG. 5, a method 500 is illustrated. The method 500 includes acts for forming a photocathode. The method 500 includes forming an improved substrate stack by forming: a GaAs substrate; and one or more additional layers on the GaAs substrate, the one or more additional layers configured to provide an improved substrate stack surface with predetermined characteristics for forming a semiconductor device on the improved substrate stack surface (act 510). For example, in some embodiments, the predetermined characteristics may comprise a misfit defect or threading dislocation density less than $1e^7$ counts per square centimeter.

The method 500 further includes forming an InGaAs p-type photocathode on the improved substrate stack surface, the InGaAs p-type photocathode having a predetermined percentage of In (act 520).

The method 500 may be practiced where forming the one or more additional layers on the GaAs substrate comprises forming a plurality of step graded InGaAs layers which gradually increase an amount of Indium doping from layer to layer from a first layer more proximate the GaAs substrate to a final layer less proximate the GaAs substrate. This is illustrated in FIG. 4 which illustrates the step graded portion 408 with increasing Indium doping from layer 408-1 to layer 408-OS. Note that in some embodiments, the layer 408-OS may not be included, but rather layers 408-1 to 408-n may be the graded layers.

The method 500 may be practiced where forming the one or more additional layers on the GaAs substrate comprises forming an overshoot layer having a first amount of Indium doping that is greater than second amount of doping in the InGaAs p-type photocathode to reduce strain. Thus, for example, in FIG. 4 the layer 408-OS has more Indium content than the active layer 416.

The method 500 may be practiced where forming the one or more additional layers on the GaAs substrate comprises forming a plurality of step graded InGaAs layers which gradually increase an amount of Indium doping from layer to layer from a first layer more proximate the GaAs substrate to a final layer less proximate the GaAs substrate, wherein the overshoot layer has a first amount of Indium doping that is greater than second amount of doping in the InGaAs p-type photocathode to reduce strain in layers from the GaAs substrate to the InGaAs p-type photocathode.

The method 500 may further include forming the overshoot layer to be thick as compared to other layers between the overshoot layer and the GaAs substrate. Thus, for example, the layer 408-OS may be thick as compared to layers 408-1 through 408-n.

The method 500 may be practiced where forming an improved substrate stack comprises forming an InGaP etch stop layer to prevent surface damage. Thus, for example, the etch stop layer 412 may be formed as shown in FIG. 4.

The method 500 may further includes removing the improved substrate stack. Thus, for example, as illustrated in FIG. 3, the improved substrate stack 402 may be removed when finishing the photocathode 106. In some such embodiments, a CsO layer may be formed on an active layer of the InGaAs p-type photocathode. An example of this is illustrated by the layer 424 illustrated in FIG. 3.

The method 500 may further include forming a window layer on an active layer of the InGaAs p-type photocathode. An example of this is illustrated by the window layer 418 illustrated in FIGS. 3 and 4.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A photocathode epitaxial structure comprising:
an improved substrate stack, the improved substrate stack comprising:
a GaAs substrate; and
one or more additional layers formed on the GaAs substrate, the one or more additional layers configured to provide an improved substrate stack surface with predetermined characteristics for forming a semiconductor device on the improved substrate stack surface; and
an InGaAs p-type photocathode formed on the improved substrate stack surface, the InGaAs p-type photocathode having a predetermined percentage of In,
wherein the improved substrate comprises an overshoot layer having a first amount of Indium doping that is greater than second amount of doping in the InGaAs p-type photocathode to reduce strain.

2. The photocathode epitaxial structure of claim 1, wherein the improved substrate comprises a plurality of step graded InGaAs layers which gradually increase an amount of Indium doping from layer to layer from a first layer more proximate the GaAs substrate to a final layer less proximate the GaAs substrate to reduce strain in layers from the GaAs substrate to the InGaAs p-type photocathode.

3. A photocathode epitaxial structure comprising:
an improved substrate stack, the improved substrate stack comprising:
a GaAs substrate; and
one or more additional layers formed on the GaAs substrate, the one or more additional layers configured to provide an improved substrate stack surface with predetermined characteristics for forming a semiconductor device on the improved substrate stack surface; and
an InGaAs p-type photocathode formed on the improved substrate stack surface, the InGaAs p-type photocathode having a predetermined percentage of In,
wherein the improved substrate comprises a plurality of step graded InGaAs layers which gradually increase an amount of Indium doping from layer to layer from a first layer more proximate the GaAs substrate to an overshoot layer less proximate the GaAs substrate, wherein the overshoot layer has a first amount of Indium doping that is greater than second amount of doping in the InGaAs p-type photocathode to reduce strain in layers from the GaAs substrate to the InGaAs p-type photocathode.

4. The photocathode epitaxial structure of claim 3, wherein the overshoot layer is thick as compared to other layers between the overshoot layer and the GaAs substrate.

5. The photocathode epitaxial structure of claim 1, wherein the improved substrate comprises an InGaP etch stop layer to prevent surface damage.

6. The photocathode epitaxial structure of claim 1, wherein the InGaAs p-type photocathode formed on the improved substrate stack surface has a direct optical band gap of 1.1 eV±30% at 300 Kelvin.

7. The photocathode epitaxial structure of claim 1, wherein the InGaAs p-type photocathode formed on the improved substrate stack surface detects optical wavelengths up to at least 1064 nm.

8. The photocathode epitaxial structure of claim 1, wherein the InGaAs p-type photocathode formed on the improved substrate stack surface detects optical wavelengths up to at least 1200 nm.

9. The photocathode epitaxial structure of claim 1, wherein the InGaAs p-type photocathode formed on the improved substrate stack surface detects optical wavelengths up to at least 1550 nm.

10. A method of forming a photocathode, the method comprising:
forming an improved substrate stack by forming:
a GaAs substrate; and
one or more additional layers on the GaAs substrate, the one or more additional layers configured to provide an improved substrate stack surface with predetermined characteristics for forming a semiconductor device on the improved substrate stack surface; and
forming an InGaAs p-type photocathode on the improved substrate stack surface, the InGaAs p-type photocathode having a predetermined percentage of In,
wherein forming the one or more additional layers on the GaAs substrate comprises forming an overshoot layer having a first amount of Indium doping that is greater than second amount of doping in the InGaAs p-type photocathode to reduce strain.

11. The method of claim 10, wherein forming the one or more additional layers on the GaAs substrate comprises forming a plurality of step graded InGaAs layers which gradually increase an amount of Indium doping from layer to layer from a first layer more proximate the GaAs substrate to a final layer less proximate the GaAs substrate.

12. A method of forming a photocathode, the method comprising:
forming an improved substrate stack by forming:
a GaAs substrate; and
one or more additional layers on the GaAs substrate, the one or more additional layers configured to provide an improved substrate stack surface with predetermined characteristics for forming a semiconductor device on the improved substrate stack surface; and
forming an InGaAs p-type photocathode on the improved substrate stack surface, the InGaAs p-type photocathode having a predetermined percentage of In,
wherein forming the one or more additional layers on the GaAs substrate comprises forming a plurality of step graded InGaAs layers which gradually increase an amount of Indium doping from layer to layer from a first layer more proximate the GaAs substrate to an overshoot layer less proximate the GaAs substrate, wherein the overshoot layer has a first amount of Indium doping that is greater than second amount of doping in the InGaAs p-type photocathode to reduce strain in layers from the GaAs substrate to the InGaAs p-type photocathode.

13. The method of claim 12, further comprising forming the overshoot layer to be thick as compared to other layers between the overshoot layer and the GaAs substrate.

14. The method of claim 10, wherein forming an InGaAs p-type photocathode comprises forming an active layer doped exponentially by p-type impurities with levels of doping increasing away from an interface between the InGaAs p-type photocathode and the substrate stack.

15. The method of claim 10, further comprising forming a fully strained GaAs layer to be between an etch stop layer and an active layer of the InGaAs p-type photocathode.

16. The method of claim 15, further comprising forming a CsO layer on the fully strained layer for activation.

17. The method of claim 10, further comprising forming a window layer on an active layer of the InGaAs p-type photocathode.

18. A photocathode epitaxial structure comprising:
an improved substrate stack, the improved substrate stack comprising:
   a GaAs substrate;
   a plurality of step graded InGaAs layers which gradually increase an amount of Indium doping from layer to layer from a first layer more proximate the GaAs substrate to a final layer less proximate the GaAs substrate; and
an InGaAs p-type photocathode formed on the improved substrate stack, the InGaAs p-type photocathode having a predetermined percentage of In; and
wherein the final layer is an overshoot layer having a first amount of Indium doping that is greater than second amount of doping in the InGaAs p-type photocathode, and wherein the overshoot layer is thick as compared to other layers between the overshoot layer and the GaAs substrate.

* * * * *